US011340489B2

(12) United States Patent
Chien

(10) Patent No.: US 11,340,489 B2
(45) Date of Patent: May 24, 2022

(54) MANUFACTURING METHOD OF DISPLAY PANEL AND DISPLAY PANEL

(71) Applicants: HKC Corporation Limited, Shenzhen (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 258 days.

(21) Appl. No.: 16/461,376

(22) PCT Filed: May 10, 2017

(86) PCT No.: PCT/CN2017/083777
§ 371 (c)(1),
(2) Date: May 16, 2019

(87) PCT Pub. No.: WO2018/188143
PCT Pub. Date: Oct. 18, 2018

(65) Prior Publication Data
US 2020/0064684 A1    Feb. 27, 2020

(30) Foreign Application Priority Data

Apr. 11, 2017   (CN) .......................... 201710234722.7

(51) Int. Cl.
*G02F 1/1335* (2006.01)
*G03F 7/42* (2006.01)

(52) U.S. Cl.
CPC ........ *G02F 1/133516* (2013.01); *G03F 7/425* (2013.01)

(58) Field of Classification Search
None
See application file for complete search history.

(56) References Cited

U.S. PATENT DOCUMENTS 5,338,631 A * 8/1994 Masubuchi .......... G03G 13/016
                                                      430/42.1
5,385,795 A * 1/1995 Yuasa .................. G03F 7/0007
                                                      205/120
(Continued)

FOREIGN PATENT DOCUMENTS

CN         1577112 A     2/2005
CN       101373343 A     2/2009
(Continued)

OTHER PUBLICATIONS

Lijuan Peng, the ISA written comments, dated Jan. 2018, CN.
Lijuan Peng, the International Search Report, dated Jan. 2018, CN.

*Primary Examiner* — Allan W. Olsen

(57) ABSTRACT

The present application discloses a manufacturing method of a display panel and a display panel. The manufacturing method includes the steps: forming a color filter layer on a substrate; confirming a color filter-to-be-stripped in the color filter layer; and stripping the color filter-to-be-stripped by using a selected stripping liquid; the color filter layer includes a first color filter, a second color filter and a third color filter; and the color filter-to-be-stripped includes one or two of the first color filter, the second color filter and the third color filter, and the method of stripping the color filter-to-be-stripped by the selected stripping liquid includes: letting the color filter-to-be-stripped react with the selected stripping liquid, and stripping the color filter-to-be-stripped by the selected stripping liquid, and forming a protective layer on the surface of the color filters except the color filter-to-be-stripped.

12 Claims, 3 Drawing Sheets

(56) References Cited

U.S. PATENT DOCUMENTS

| | | | | |
|---|---|---|---|---|
| 5,876,882 | A * | 3/1999 | Yoda | G03F 7/0007 |
| | | | | 430/7 |
| 7,410,822 | B2 * | 8/2008 | Wu | G02B 5/201 |
| | | | | 438/57 |
| 7,470,491 | B2 * | 12/2008 | Lee | G02F 1/13394 |
| | | | | 430/7 |
| 7,491,477 | B2 * | 2/2009 | Fukai | G02F 1/133516 |
| | | | | 349/192 |
| 7,911,566 | B2 * | 3/2011 | Park | G02B 5/201 |
| | | | | 349/106 |
| 8,334,246 | B2 * | 12/2012 | Lee | G02F 1/133516 |
| | | | | 510/109 |
| 8,564,762 | B2 * | 10/2013 | Kim | G03F 7/7055 |
| | | | | 355/71 |
| 8,933,623 | B2 * | 1/2015 | Hanamura | H01L 27/322 |
| | | | | 313/504 |
| 9,473,753 | B2 * | 10/2016 | Lin | H01L 27/14623 |
| 10,177,176 | B2 * | 1/2019 | Kim | G02F 1/1362 |
| 2008/0204580 | A1 * | 8/2008 | Holscher | H01L 21/31058 |
| | | | | 348/273 |
| 2016/0170260 | A1 * | 6/2016 | Wachi | G02F 1/133526 |
| | | | | 359/741 |

FOREIGN PATENT DOCUMENTS

| | | | |
|---|---|---|---|
| JP | 2006018252 A | | 1/2006 |
| JP | 2006208716 A | | 8/2006 |
| KR | 20090019299 A | * | 2/2009 |

* cited by examiner

MANUFACTURING METHOD OF DISPLAY PANEL AND DISPLAY PANEL

This application claims priority to Chinese Patent Application No. CN2017102347227, filed with the Chinese Patent Office on Apr. 11, 2017 and entitled "MANUFACTURING METHOD OF DISPLAY PANEL AND DISPLAY PANEL", which is incorporated herein by reference in its entirety.

TECHNICAL FIELD

The application relates to the technical field of display, and particularly relates to a manufacturing method of a display panel and a display panel.

BACKGROUND

The statements in this section merely provide background information related to the present application and may not constitute prior art.

With the development and progress of science and technology, liquid crystal display apparatuses become a main product of display apparatuses due to such advantages as a thin body, power savings, low radiation, etc. and are widely used. Most liquid crystal display apparatuses in the market are backlit liquid crystal display apparatuses, each including a liquid crystal panel and a backlight module. Working principle of the liquid crystal panel is that liquid crystals are disposed between two parallel substrates, and a driving voltage is applied to the two substrates to control rotational direction of the liquid crystals, to refract light rays of the backlight module to generate a picture.

Thin film transistor-liquid crystal display apparatuses (TFT-LCD) maintain a leading state in the display field because of low power consumption, excellent picture quality, high production yield, and other properties. Similarly, the thin film transistor-liquid crystal display apparatus includes a liquid crystal panel and a backlight module. The liquid crystal panel includes a color filter substrate (CF substrate), a thin film transistor substrate (TFT substrate) and a mask, and transparent electrodes on respective inner sides of the above substrates. A layer of liquid crystals (LC) is positioned between two substrates.

In the manufacturing process or repair process of the color filter substrate, the situation where one or some color filters have problems and then need reworking or repairing often occurs. However, the exemplary method of stripping a color filter is that the some color filters are all stripped in general to return to the state of a mother glass, and then the manufacturing process of the color filter substrate is restarted, in this way, manufacturing methods and materials may be wasted, and the defective rate is relatively high when reworking from the mother glass.

It should be noted that the above introduction of the technical background is described only to clearly and fully describe the technical solution of the exemplary application conveniently, and facilitate the understanding of those of ordinary skill in the art. The above-mentioned technical solutions shall not be considered as well-known solutions by those of ordinary skill in the art just because these solutions are described in the background of the present application.

SUMMARY

In view of the above-mentioned defects in the prior art, a technical problem to be solved by the present application is to provide a manufacturing method of a display panel which may always selectively strip color filters having problems, and a display panel.

To achieve the above purpose, this application provides a manufacturing method of a display panel, including the steps.
  forming a color filter layer on a substrate;
  confirming a color filter-to-be-stripped in the color filter layer; and
  stripping the color filter-to-be-stripped by a selected stripping liquid;
  the color filter layer includes a first color filter, a second color filter and a third color filter, and the color filter-to-be-stripped includes one or two of the first color filter, the second color filter and the third color filter;
  The method of stripping the color filter-to-be-stripped by the selected stripping liquid includes steps:
  reacting the color filter-to-be-stripped with the selected stripping liquid, and stripping the color filter-to-be-stripped by the selected stripping liquid, to form a protective layer on the surface of the color filters except the color filter-to-be-stripped;
  a first addition added to the first color filter, a second addition added to the second color filter and a third addition added to the third color filter;
  The method of forming a protective layer on the surface of the color filters except the color filter-to-be-stripped includes steps:
  making one or two of the first addition, the second addition and the third addition react with the selected stripping liquid, and forming a protective layer on the surface of the color filters except the color filter-to-be-stripped;
  the selected stripping liquid includes the compositions: an alkali compound, an alcohol compound, water and a specific additive, and the specific additive includes, one or two of a first additive reacting with the first addition to form a protective layer, a second additive reacting with the second addition to form a protective layer, and a third additive reacting the third addition to form a protective layer, corresponding to the color filter-to-be-stripped.

The present application provides a manufacturing method of a display panel, including the steps:
  forming a color filter layer on a substrate;
  confirming a color filter-to-be-stripped in the color filter layer; and
  stripping the color filter-to-be-stripped by using a selected stripping liquid.

Optionally, the color filter layer includes a first color filter, a second color filter and a third color filter, and the color filter-to-be-stripped includes one or two of the first color filter, the second color filter and the third color filter.

The method of stripping the color filter-to-be-stripped using the selected stripping liquid includes: letting the color filter-to-be-stripped react with the selected stripping liquid, and stripping the color filter-to-be-stripped by the selected stripping liquid, and forming a protective layer on the surface of the color filters except the color filter-to-be-stripped.

Optionally, the first color filter is a red color filter, the second color filter is a green color filter, and the third color filter is a blue color filter.

Optionally, a first addition added to the first color filter, a second addition added to the second color filter and a third addition added to the third color filter; and the method of forming a protective layer on the surface of the color filters except the color filter-to-be-stripped includes: acting one or two of the first addition, the second addition and the third addition with the selected stripping liquid, and forming a protective layer on the surface of the color filters except the color filter-to-be-stripped.

Optionally the selected stripping liquid includes the compositions, an alkali compound, an alcohol compound, water and a specific additive includes: one or two of a first additive reacting with the first addition to form a protective layer, a second additive reacting with the second addition to form a protective layer and a third additive reacting the third addition to form a protective layer corresponding to the color filter-to-be-stripped.

Optionally, after the step of stripping the color filter-to-be-stripped by using the selected stripping liquid, the method includes the step: reforming a corresponding color filter on the substrate at the position corresponding to the color filter-to-be-stripped.

Optionally, the color filter layer includes a first color filter, a second color filter, a third color filter and a fourth color filter, and the color filter-to-be-stripped includes one, two or three of the first color filter, the second color filter, the third color filter and the fourth color filter, the method of stripping the color filter-to-be-stripped by using the selected stripping liquid includes:

letting the color filter-to-be-stripped react with the selected stripping liquid, and stripping the color filter-to-be-stripped by the selected stripping liquid and forming a protective layer on the surface of the color filters except the color filter-to-be-stripped.

Optionally a first addition, a second addition added to the second color filter, and, a third addition added to the third color.

The method of forming a protective layer on the surface of the color filters except the color filter-to-be-stripped includes coming into contact with the selected stripping liquid includes: making one, two or three of the first addition, the second addition, the third addition and the fourth addition react with the selected stripping liquid, and forming a protective layer on the surface of the color filters except the color filter-to-be-stripped.

Optionally, the selected stripping liquid includes the compositions, an alkali compound, an alcohol compound, water and a specific additive, and the specific additive includes one, two or three of a first additive reacting with the first addition to form a protective layer, a second additive reacting with the second addition to form a protective layer, a third additive reacting the third addition to form a protective layer, and a fourth additive reacting with the fourth addition to form a protective layer corresponding to the color filter-to-be-stripped.

Optionally, the first color filter is a red color filter, the second color filter is a green color filter, the third color filter is a blue color filter, and the fourth color filter is a white color filter.

Optionally, the first addition, the second addition and the third addition use an alkali metal salt or an alkaline-earth metal salt of permanganic acid, tungstic acid or molybdic acid, and multiple oxalic acid salts of molybdate ammonium or vanadium, niobium or tantalum as necessary component.

Optionally, first additive, the second additive and the third additive use corresponding acidic compounds to react with the first addition, the second addition or the third addition to form high-dense oxide, thereby forming a protective layer.

This application discloses a display panel, including: a substrate; and a color filter layer disposed on the substrate, the color filter layer includes at least two color filters, a specific addition reacting with the selected stripping liquid to form a protective layer on the surface of a corresponding color filter is added to at least one of the color filters.

Optionally, the color filter layer includes a first color filter, a second color filter and a third color filter. If one or two of the first color filter, the second color filter and the third color filter is/are color filter-to-be-stripped, a specific addition reacting with the selected stripping liquid to form a protective layer on the surface of a corresponding color filter is added to the color filters except the color filter-to-be-stripped.

The method of stripping a color filter of the present application may be applied to the manufacturing process of the color filter substrate (CF), and may be applied to the later repair process of the color filters in the color filter substrate as well. The present application is mainly invented for stripping color filters having problems without processing other color filters having no problem. For example, if the R color filter in the color filter layer has problems but the G color filter and the B color filter have no problem, a selected stripping liquid which only has a cleaning and stripping effect on the R color filter may be selected to strip the R color filter. Thus, only the R color filter which has problems is reworked or repaired. In this way, the problem of relatively high defective rate when reworking or repairing from the mother glass may be avoided, thereby reducing waste of manufacturing processes, reducing waste of materials, and being beneficial to improving the yield of color filter substrates.

Specific embodiments of the present application are disclosed in detail in reference with the subsequent explanation and figures, and the manner in which the principles of the present application may be adopted is indicated. It should be understood that the range scope of the embodiments of the present application is not limited thereto. Within the range of the spirit and clauses of the appended claims, embodiments of the present application include many alterations, modifications and equivalents.

Features described and/or shown for one embodiment may be used in one or two other embodiments in the same or similar manner, to combine with features in other embodiments, or replace the features in other embodiments.

It should be emphasized that the terms "include" and/or "include" used herein specify the existence of features, integers, steps or assemblies, not excluding the existence or addition of one or two other features, integers, steps or assemblies.

BRIEF DESCRIPTION OF DRAWINGS

The drawings included are used for providing further understanding of embodiments of the present application, constitute part of the description, are used for illustrating implementation manners of the present application, and interpreted principles of the present application together with text description. Apparently, the drawings in the following description are merely some embodiments of the present application, and for those ordinary skilled in the art, other drawings can also be obtained according to the drawings without contributing creative labor. In the drawings.

DETAILED DESCRIPTION

To make those of ordinary skill in the art preferably understand technical solutions in the present application, the technical solution in the embodiments of the present invention will be clearly and fully described below in combination with the drawings in the embodiments of the present invention. Apparently, the described embodiments are merely part of the embodiments of the present invention, not all of the embodiments. Based on the embodiments in the present application, all other embodiments obtained by those of ordinary skill in the an without contributing creative labor will belong to the protection scope of the present application.

Figure 1:
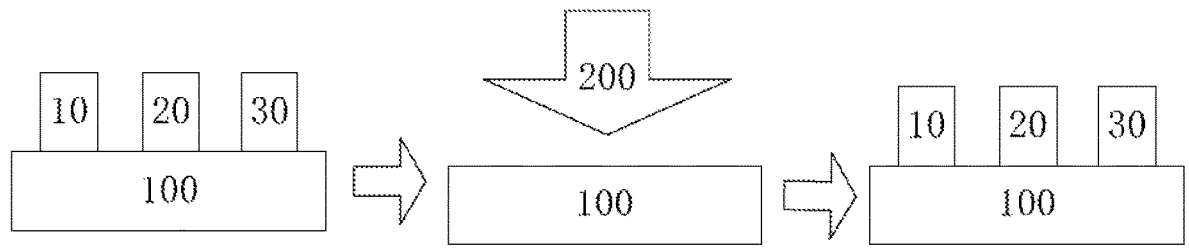
FIG. 1 is a schematic diagram of a method of stripping a color filter having problems used by the inventor of the present application.

FIG. 1 is a schematic diagram of a method of stripping a color filter having problems used by the inventor of the present application. The color filter may be stripped in the manufacturing process or repair process of the color filter substrate. In these processes, the situation where one or some color filters have problems and then need reworking or repairing often occurs. However, the inventor already uses but does not disclose this method of stripping a color filter: the some color filters are all stripped in general to return to the state of a mother glass, and then the manufacturing process of the color filter substrate is restarted. Referring to FIG. 1, for example, the color filter layer includes a first color filter 10, a second color filter 20 and a third color filter 30, when the third color filter 30 has problems and needs reworking, all color filters of the color filter layer are required to be stripped using a general stripping liquid 200 to return to the state of a mother glass 100, and then a color filter layer is redisposed on the mother glass 100. In this way, manufacturing processes and materials are wasted, and the defective rate is relatively high when reworking from the mother glass. (The first color filter 10, the second color filter 20 and the third color filter 30 may refer to a red color filter, a blue color filter, a green color filter of the RGB color filter.)

Figure 2:
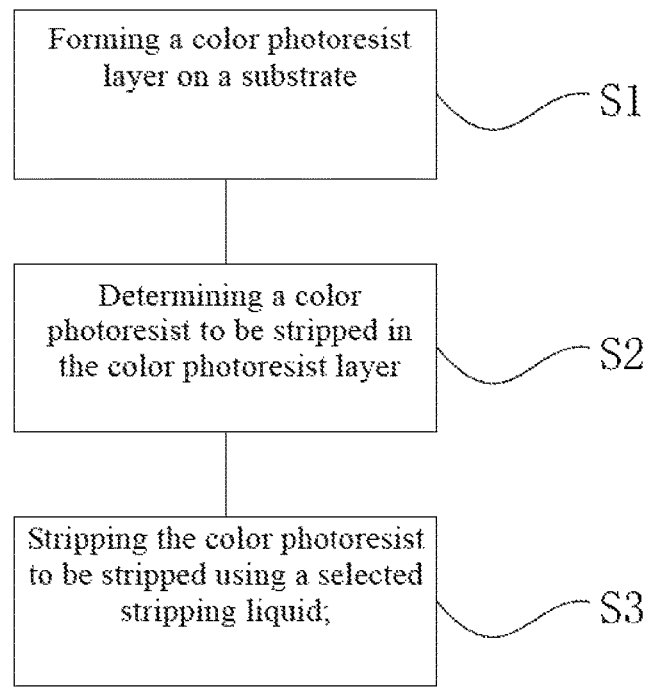
FIG. 2 is a flowchart of a manufacturing method of a display panel of an embodiment of the present application.

FIG. 2 is a flowchart of a manufacturing method of a display panel of an embodiment of the present application. Referring to FIG. 1, it can be known that the method includes the steps:

S1: forming a color filter layer on a substrate;

S2: confirming a color filter-to-be-stripped in the color filter layer; and

S3: stripping the color filter-to-be-stripped by using a selected stripping liquid.

The solution of selectively stripping the color filter having problems of the present application may be applied to the manufacturing process of the color filter substrate (CF), and may be applied to the later repair process of the color filters in the color filter substrate as well. The present application is mainly invented for stripping color filters having problems without processing other color filters having no problem. For example, if the R color filter in the color filter layer has problems but the G color filter and the B color filter have no problem, a selected stripping liquid which only has a cleaning and stripping effect on the R color filter may be selected to strip the R color filter. Thus, only the R color filter which has problems is reworked or repaired. In this way, the problem of relatively high defective rate when reworking or repairing from the mother glass may be avoided, thereby reducing waste of manufacturing processes, reducing waste of materials, and being beneficial to improving the yield of color filter substrates.

The color filter-to-be-stripped refers to an abnormal color filter in the color filter layer, and the abnormal color filter is stripped by using a selected stripping liquid.

Figure 3:
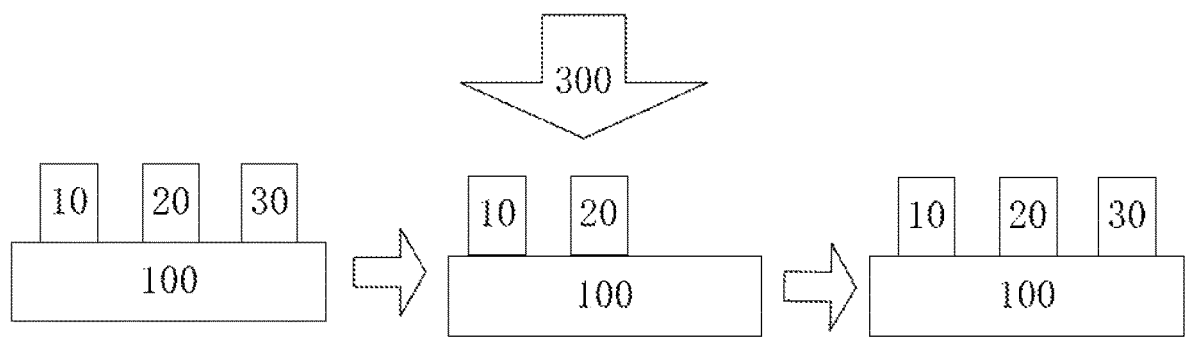
FIG. 3 is a schematic diagram of a manufacturing method of a display panel of an embodiment of the present application.

FIG. 3 is a schematic diagram of a manufacturing method of a display panel of an embodiment of the present application. Referring to FIG. 3, it can be known in combination with FIG. 2 that optionally, the color filter layer includes a first color filter 10, a second color filter 20 and a third color filter 30, and the color filter-to-be-stripped includes one or two of the first color filter, the second color filter and the third color filter.

The method of stripping the color filter-to-be-stripped by using the selected stripping liquid includes: letting the color filter-to-be-stripped react with the selected stripping liquid, and stripping the color filter-to-be-stripped by the selected stripping liquid and forming a protective layer on the surface of the color filters except the color filter-to-be-stripped. In one and more embodiments, the color filter layer includes a first color filter, a second color filter and a third color filter. If one or two of the three color filters have problems and need stripping, a selected stripping liquid which may react with the perfect color filter to form a protective layer on the surface of the perfect color filter is selected. In this way, the selected stripping liquid may only strip the color filter-to-be-stripped, so that the perfect color filter is reserved. The solution omits the situation where reworking is repeated in the manufacturing process of the display panel, and reduces waste of materials. Moreover, because the color filters are not indistinguishably stripped to return to the state of a mother glass, the defective rate of finished products may be effectively reduced.

Specifically, as shown in FIG. 3, if the third color filter 30 has problems and needs stripping, the third color filter 30 may be selectively stripped only using a selected stripping liquid 300. The reason is that the selected stripping liquid 300 forms a protective layer on the surface of the first color filter 10 and the second color filter 20 to prevent same from being stripped, so that the color filter having problems may be selectively stripped without indistinguishably stripping color filters, to rework the color filter after returning same to the state of the mother glass 100. (Of course, color filters to be stripped may be two of the color filters as well.)

The first color filter 10, the second color filter 20 and the third color filter 30 may refer to a red color filter, a blue color filter and a green color filter of the RGB color filter in general. Of course, color filters of other types may be acceptable as well so long as they are applicable.

In one and more embodiments, the color filter layer includes a first color filter, a second color filter and a third color filter; and the color filter-to-be-stripped includes one or two of the first color filter, the second color filter and the third color filter, and the method of stripping the color filter-to-be-stripped by the selected stripping liquid includes: letting the color filter-to-be-stripped react with the selected stripping liquid, and stripping the color filter-to-be-stripped by the selected stripping liquid, and forming a protective layer on the surface of the color filters except the color filter-to-be-stripped. In one and more embodiments, the reason that the protective layer may be disposed on the color filters except the color filter-to-be-stripped is because the first addition, the second addition and the third addition are added to the first color filter, the second color filter and the third color filter respectively. In this way, the color filter may be selectively stripped so long as a specific additive which may react with one or two of the first addition, the second addition and the third addition to form a protective layer is added to the selected stripping liquid, thereby omitting the situation where the perfect color filter also needs reworking.

In one and more embodiments, the selected stripping liquid includes the compositions: an alkali compound, an alcohol compound, water and a specific additive, and the specific additive includes one or two of a first additive reacting with the first addition to form a protective layer, a second additive reacting with the second addition to form a protective layer and a third additive reacting the third addition to form a protective layer corresponding to the color filter-to-be-stripped. In one and more embodiments, different specific additives may be added to the selected stripping liquid according to different compositions of color filters to be stripped specifically, so that specific additions in the perfect color filter may react with the specific additives to form a protective layer, and no protective layer is disposed on the color filter-to-be-stripped, thereby selectively stripping the color filter.

In one and more embodiments, after the step of stripping the color filter-to-be-stripped by using the selected stripping liquid, the method further includes the step:
  reforming a corresponding color filter on the substrate in the position corresponding to the color filter-to-be-stripped.

In one and more embodiments, after the color filter having problems on the substrate is stripped, only a corresponding color filter is required to be redisposed in the position corresponding thereto without reworking the entire color filter layer, thereby reducing manufacturing processes, reducing waste of materials, and contributing to improving the yield of finished products.

Figure 4:
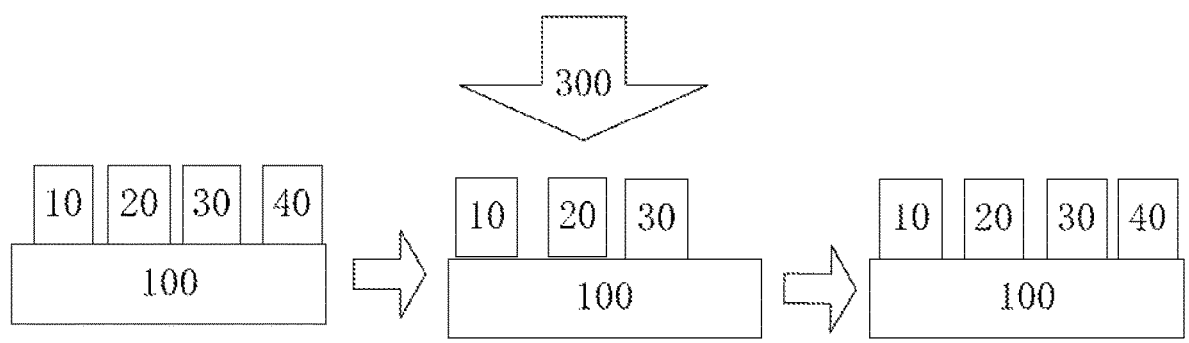
FIG. 4 is a second schematic diagram of a manufacturing method of a display panel of an embodiment of the present application.

FIG. 4 is a second schematic diagram of a manufacturing method of a display panel of an embodiment of the present application. Referring to FIG. 4, it can be known that the color filter layer includes a first color filter 10, a second color filter 20, a third color filter 30 and a fourth color filter 40, and the color filter-to-be-stripped includes one, two or three of the first color filter 10, the second color filter 20, the third color filter 30 and the fourth color filter 40.

The method of stripping the color filter-to-be-stripped by using the selected stripping liquid includes: letting the color filter-to-be-stripped react with the selected stripping liquid, and stripping the color filter-to-be-stripped by the selected stripping liquid and forming a protective layer on the surface of the color filters except the color filter-to-be-stripped. In one and more embodiments, the color filter layer includes a first color filter, a second color filter, a third color filter and a fourth color filter. If one, two or three of the four color filters have problems and need stripping, a selected stripping liquid which may react with the perfect color filter to form a protective layer on the surface of the perfect color filter is selected. In this way, the selected stripping liquid may only strip the color filter-to-be-stripped, so that the perfect color filter is reserved. The solution omits the situation where reworking is repeated in the manufacturing process of the display panel, and reduces waste of materials. Moreover, because the color filters are not indistinguishably stripped to return to the state of a mother glass, the defective rate of finished products may be effectively reduced.

Referring to FIG. 4, in the same way as FIG. 3, the color filter layer may include four color filters, i.e. a first color filter 10, a second color filter 20, a third color filter 30 and a fourth color filter 40. If the fourth color filter 40 has problems and needs stripping and reworking, the fourth color filter 40 may be selectively stripped only using a selected stripping liquid 300. The reason is that the selected stripping liquid 300 forms a protective layer on the surface of the first color filter 10, the second color filter 20 and the third color filter 30 to prevent same from being stripped, so that the color filter having problems may be selectively stripped without indistinguishably stripping color filters, to rework the color filter after returning same to the state of the mother glass 100. (Of course, color filters to be stripped may be two or three of the color filters as well). The color filter layer may be a Red, Green Blue White color filter layer, the first color filter 10 may be a red color filter, the second color filter 20 may be a green color filter, the third color filter 30 may be a blue color filter, and the fourth color filter 40 may be a white color filter. Of course, color filter layers of other types may be acceptable as well so long as they are applicable.

In one and more embodiments, a first addition, a second addition, a third addition and a fourth addition are added to the first color filter, the second color filter and the third color filter respectively. The method of forming a protective layer on the surface of the color filters except the color filter-to-be-stripped coming into contact with the selected stripping liquid includes:
  making one, two or three of the first addition, the second addition, the third addition and the fourth addition react with the selected stripping liquid, and forming a protective layer on the surface of the color filters except the color filter-to-be-stripped.

In one and more embodiments, the protective layer may be disposed on the color filters except the color filter-to-be-stripped is because the first addition, the second addition and the third addition are added to the first color filter, the second color filter and the third color filter respectively. In this way, the color filter may be selectively stripped so long as a specific additive which may react with one or two of the first addition, the second addition and the third addition to form a protective layer is added to the selected stripping liquid, thereby omitting the situation where the perfect color filter needs reworking.

In one and more embodiments, the selected stripping liquid includes the compositions: an alkali compound, an alcohol compound, water and a specific additive and the specific additive includes one, two or three of a first additive reacting with the first addition to form a protective layer, a second additive reacting with the second addition to form a protective layer, a third additive reacting the third addition to form a protective layer and a fourth additive reacting with the fourth addition to form a protective layer corresponding to the color filter-to-be-stripped. In one and more embodiments, different specific additives may be added to the selected stripping liquid according to different compositions of color filters to be stripped specifically, so that specific additions in the perfect color filter may react with the specific additives to form a protective layer, and no protective layer is disposed on the color filter-to-be-stripped, thereby selectively stripping the color filter.

Figure 5:
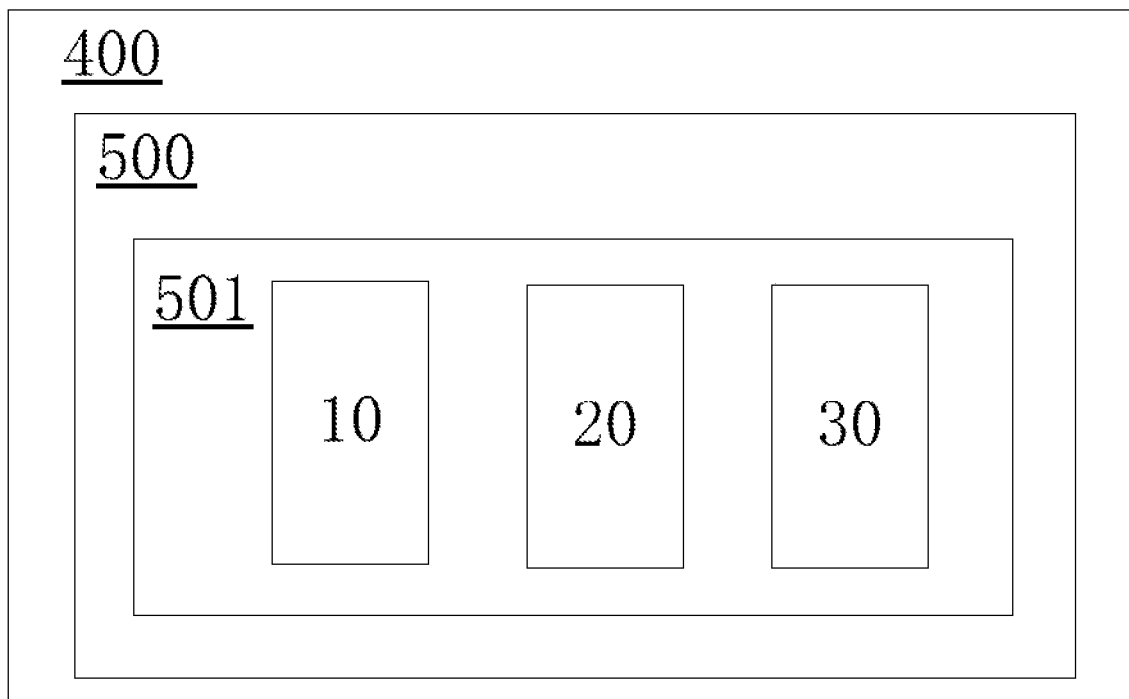
FIG. 5 is a schematic diagram of a display panel of an embodiment of the present application.

FIG. 5 is a schematic diagram of a display panel of an embodiment of the present application. Referring to FIG. 5 in combination with embodiments shown in FIGS. 1-4, the present application further discloses a display panel 400, including:
  a substrate 500; and a color filter layer 501 disposed on the substrate 500, the color filter layer 501 includes a color filter-to-be-stripped, the color filter-to-be-stripped is used for reacting with a selected stripping liquid to be stripped. The color filter layer 501 includes at least two color filters, and a specific addition reacting with the selected stripping liquid to form a protective layer on the surface of a corresponding color filter is added to at least one of the color filters (not shown in the FIG.). The method of selectively stripping a color filter having problems of the present application may be applied to the manufacturing process of the color filter substrate (CF), and may be applied to the later repair process of the color filters in the color filter substrate as well. The present application is mainly invented for stripping color filters having problems without processing other color filters having no problem. For example, if the R color filter in the color filter layer has problems but the G color filter and the B color filter have no problem, a selected stripping liquid which only has a cleaning and stripping effect on the R color filter may be selected to strip the R color filter. Thus, only the R color filter which has problems is reworked or repaired. In this way, the problem of relatively high defective rate when reworking or repairing from the mother glass may be avoided, thereby reducing waste of manufacturing processes, reducing waste of materials, and being beneficial to improving the yield of color filter substrates.

Specifically, In one and more embodiments, the color filter layer of the display panel includes at least two color filters. Different specific additions are added to different color filters. When a certain color filter needs stripping, a selected stripping liquid which may react with the specific additions in the color filters except the color filter-to-be-stripped to form a protective layer may be selected. In this way, color filters having problems may be selectively stripped without reworking all color filters, thereby improving the working efficiency.

In one and more embodiments, the color filter layer 501 includes a first color filter 10, a second color filter 20 and a third color filter 30.

If one or two of the first color filter, the second color filter and the third color filter is are color filter-to-be-stripped, a specific addition reacting with the selected stripping liquid to form a protective layer on the surface of a corresponding color filter is added to the color filters except the color filter-to-be-stripped. In one and more embodiments, the color filter layer of the display panel includes a first color filter, a second color filter and a third color filter (may be Red, Green, Blue color filters). Different specific additions are added to different color filters. When a certain one or two color filters need stripping, a selected stripping liquid which may react with the specific additions in the color filters except the color filter-to-be-stripped to form a protective layer may be selected. In this way, color filters having problems may be selectively stripped without reworking all color filters, thereby improving the working efficiency.

The first addition, the second addition and the third addition in the above embodiment use an alkali metal salt or an alkaline-earth metal salt of permanganic acid, tungstic acid or molybdic acid, and multiple oxalic acid salts of molybdate ammonium, or vanadium, niobium or tantalum as necessary component, the first additive, the second additive and the third additive use corresponding acidic compounds to react with the first addition, the second addition or the third addition to form high-dense oxide, thereby forming a protective layer.

Specific optional embodiments of the present application are described above in detail. It will be understood that those of ordinary skill in the art can make various modifications and alterations in accordance with the concepts of the present application without contributing creative labor. Therefore, all technical solutions obtained by those of ordinary skill in the art through logic analysis, reasoning or limited experiments in accordance with the concepts of the present application on the basis of the prior art should be within the protection range determined by the claims.

What is claimed is:

1. A manufacturing method of a display panel, including the steps:
    forming a color filter layer on a substrate;
    confirming a colorfilter-to-be-stripped in the color filter layer; and
    stripping the colorfilter-to-be-stripped by a selected stripping liquid;
    wherein the color filter layer comprises a first color filter, a second color filter and a third color filter, and the colorfilter-to-be-stripped includes one or two of the first color filter, the second color filter and the third color filter;
    the method of stripping the colorfilter-to-be-stripped by the selected stripping liquid comprises steps:
    reacting the colorfilter-to-be-stripped with the selected stripping liquid, and stripping the colorfilter-to-be-stripped by the selected stripping liquid, to form a protective layer on the surface of the color filters except the colorfilter-to-be-stripped;
    wherein a first addition added to the first color filter, a second addition added to the second color filter and a third addition added to the third color filter;
    the method of forming a protective layer on the surface of the color filters except the colorfilter-to-be-stripped comprises steps: making one or two of the first addition, the second addition and the third addition react with the selected stripping liquid, and forming a protective layer on the surface of the color filters except the colorfilter-to-be-stripped;
    wherein the selected stripping liquid comprises the compositions: an alkali compound, an alcohol compound, water and a specific additive, and the specific additive comprises: one or two of a first additive reacting with the first addition to form a protective layer, and a third additive reacting with the third addition to form a protective layer, corresponding to the colorfilter-to-be-stripped.

2. A manufacturing method of a display panel, including the steps:
    forming a color filter layer on a substrate;
    confirming a colorfilter-to-be-stripped in the color filter layer; and
    stripping the colorfilter-to-be-stripped by using a selected stripping liquid;
    wherein the color filter layer comprises a first color filter, a second color filter and a third color filter; and the colorfilter-to-be-stripped comprises one or two of the first color filter, the second color filter and the third color filter, and
    the method of stripping the colorfilter-to-be-stripped by the selected stripping liquid comprises: letting the colorfilter-to-be-stripped react with the selected stripping liquid, and stripping the colorfilter-to-be-stripped by the selected stripping liquid, and forming a protective layer on the surface of the color filters except the colorfilter-to-be-stripped.

3. The manufacturing method of the display panel according to claim 2, wherein a first addition is added to the first color filter, a second addition is added to the second color filter and a third addition is added to the third color filter; and the method of forming a protective layer on the surface of the color filters except the colorfilter-to-be-stripped comprises:

reacting one or two of the first addition, the second addition and the third addition with the selected stripping liquid, and forming a protective layer on the surface of the color filters except the colorfilter-to-be-stripped.

4. The manufacturing method of the display panel according to claim 3, wherein the selected stripping liquid comprises: an alkali compound, an alcohol compound, water and a specific additive, and the specific additive comprises: one or two of a first additive reacting with the first addition to form a protective layer, a second additive reacting with the second addition to form a protective layer, a third additive reacting the third addition to form a protective layer corresponding to the colorfilter-to-be-stripped.

5. The manufacturing method of the display panel according to claim 4, wherein the first addition, the second addition and the third addition use an alkali metal salt of permanganic acid, tungstic acid or molybdic acid or an alkaline-earth metal salt of permanganic acid, tungstic acid or molybdic acid, and multiple oxalic acid salts of molybdenum ammonium vanadium niobium or tantalum as necessary component.

6. The manufacturing method of the display panel according to claim 5, wherein the first additive, the second additive and the third additive use corresponding acidic compounds to react with the first addition, the second addition or the third addition to form oxide, thereby forming a protective layer.

7. The manufacturing method of the display panel according to claim 2, wherein after the step of stripping the colorfilter-to-be-stripped by the selected stripping liquid, the method further comprises the step: reforming a corresponding color filter on the substrate at the colorfilter-to-be-stripped.

8. The manufacturing method of the display panel according to claim 2, wherein the color filter layer comprises a fourth color filter, and the colorfilter-to-be-stripped comprises: one, two or three of the first color filter, the second color filter, the third color filter and the fourth color filter; and the method of stripping the colorfilter-to-be-stripped by using selected stripping liquid comprises: letting the colorfilter-to-be-stripped react with the selected stripping liquid, forming a protective layer on the surface of the color filters except the colorfilter-to-be-stripped.

9. The manufacturing method of the display panel according to claim 8, wherein a first addition is added to the first color filter, a second addition is added to the second color filter, a third addition is added to the third color filter, and a fourth addition is added to the fourth color filter; and the method of forming a protective layer on the surface of the color filters except the colorfilter-to-be-stripped comprises: making one, two or three of the first addition, the second addition, the third addition and the fourth addition react with the selected stripping liquid, and forming a protective layer on the surface of the color filters except the colorfilter-to-be-stripped.

10. The manufacturing method of the display panel according to claim 9, wherein the selected stripping liquid comprises: an alkali compound, an alcohol compound, water and a specific additive, and the specific additive comprises one, two or three of a first additive reacting with the first addition to form a protective layer, a second additive reacting with the second addition to form a protective layer, a third additive reacting the third addition to form a protective layer and a fourth additive reacting with the fourth addition to form a protective layer corresponding to the colorfilter-to-be-stripped.

11. The manufacturing method of the display panel according to claim 2, wherein the color filter layer comprises a fourth color filter, and the colorfilter-to-be-stripped comprises one, two or three of the first color filter, the second color filter, the third color filter and the fourth color filter; and the method of stripping the colorfilter-to-be-stripped by using the selected stripping liquid comprises: letting the colorfilter-to-be-stripped react with the selected stripping liquid, and stripping the colorfilter-to-be-stripped by the selected stripping liquid and forming a protective layer on the surface of the color filters except the colorfilter-to-be-stripped;

wherein a first addition is added to the first color filter, a second addition is added to the second color filter, a third addition is added to the third color filter, and a fourth addition is added to the fourth color filter;

wherein the method of forming a protective layer on the surface of the color filters except the colorfilter-to-be-stripped coming into contact with the selected stripping liquid comprises: making one or two of the first addition, the second addition and the third addition react with the selected stripping liquid, and forming a protective layer on the surface of the color filters except the colorfilter-to-be-stripped;

wherein the selected stripping liquid comprises the compositions: an alkali compound, an alcohol compound, water and a specific additive, and the specific additive comprises one, two or three of a first additive reacting with the first addition to form a protective layer, a second additive reacting with the second addition to form a protective layer, a third additive reacting the third addition to form a protective layer and a fourth additive reacting with the fourth addition to form a protective layer corresponding to the colorfilter-to-be-stripped.

12. The manufacturing method of the display panel according to claim 2, wherein the first color filter is a red color filter, the second color filter is a green color filter, and the third color filter is a blue color filter.

* * * * *